United States Patent [19]
Treado et al.

[11] Patent Number: 5,355,093
[45] Date of Patent: Oct. 11, 1994

[54] COMPACT MICROWAVE AND MILLIMETER WAVE AMPLIFIER

[76] Inventors: Todd A. Treado, 5 Winter St., Merrimac, Mass. 01860; Shiow-Hwa Lin, 5436 Dalen Ave., San Diego, Calif. 92122

[21] Appl. No.: 996,963

[22] Filed: Dec. 23, 1992

[51] Int. Cl.$^5$ ............................................. H03F 3/56
[52] U.S. Cl. ................................ 330/45; 315/39.57
[58] Field of Search ...................... 330/44, 45, 46, 53, 330/54, 56; 315/39.57

[56] References Cited

U.S. PATENT DOCUMENTS 4,993,033  2/1991  Lin ......................................... 372/30
5,268,648  12/1993  Calcatera .................................. 330/3

*Primary Examiner*—Steven Mottola
*Attorney, Agent, or Firm*—John R. Ross

[57] ABSTRACT

An electronic device for amplifying microwave or millimeter wave signals. A microwave or millimeter wave input signal stimulates a gated field emission array to produce a density modulated beam of electrons containing about 1 billion to 1,000 billion bunches or pulses per second which in turn illuminates a thin diamond target in a diamond switch connecting a load to a high voltage source. Each electron in each pulse creates a large number of electron hole pairs in the diamond. The high voltage bias across the diamond causes most of the very large number of pairs to be swept through the diamond target producing a high current surge in less than one half the period of the designed output frequency. Induced RF currents are set up within the resonant output cavity in response to the current flowing within the diamond. In summary, each surge of current produces an electromagnetic pulse at the load. Thus, an electromagnetic millimeter wave is produced with a frequency equal to the frequency of the signal output.

1 Claim, 6 Drawing Sheets

COMPACT MICROWAVE AND MILLIMETER WAVE AMPLIFIER

This invention is related to electronic amplifiers and to devices for the generation of electromagnetic radiation and in particular for generation of high power electromagnetic radiation within the microwave and millimeter wave frequency ranges of 1 GHz to 1,000 GHz.

BACKGROUND OF THE INVENTION

Well known electron tubes for producing microwave and millimeter wavelength radiation rely on various forms of velocity modulation of an electron beam, followed by a drift section to achieve density bunching. After bunching, the electron kinetic energy is converted into microwave or millimeter waves. In klystrons, this is achieved with two-cavity or multi-cavity arrangements. However, the bandwidth is limited in this case. To achieve wider bandwidths traveling wave velocity modulation is more appropriate. In traveling wave tubes (TWT's) electrons interact with the longitudinal electric component of a slow electromagnetic wave. The phase velocity of the electromagnetic wave is slowed down to match the electron velocity, and thereby continuous and cumulative interaction between the electron beam and the wave can take place producing microwaves or millimeter waves over bandwidths as wide as one octave or more. These devices are referred to as slow wave structures. The simplest slow wave structure used in many wide bandwidth TWT's is the helix waveguide. Bandwidth over one octave is common. Other slow wave structures are also well known.

It is known that pulses of electrons can be produced with gated field emitter arrays. Details regarding gated field emission arrays are provided by C. A. Spindt, C. E. Holland, A. Rosengreen and I. Brodie in "Field-Emitter Arrays for Vacuum Microelectronics" IEEE Transactions on Electron Devices Vol. 38 No. 10, October, 1991.

Field emission arrays are also disclosed in U.S. Pat. Nos. 5,063,323 issued 1992, 5,064,396 issued 1992, 3,453,478 issued Jul. 1, 1969, 3,665,241 issued May 23, 1972 and 3,755,704 issued Aug. 28, 1973. An amplifier employing a field emission array is disclosed in U.S. Pat. No. 4,780,684 issued Oct. 25, 1988.

The electron bombarded semiconductor amplifiers have been built, and various methods have been used to provide the bunched electron beam. A review of the different methods is reported by A. Silzars, D. J. Bates, and A. Ballonoff, in "Electron Bombarded Semiconductor Devices," Proceedings of the IEEE, vol. 62, no. 8, August 1974, pp. 1119–1158. The bunched electron beam can be provided by a gridded thermionic cathode, such as used in a conventional triode, which density modulates the electron beam. Grid-to-cathode capacitance and transit time effects limit the bandwidth of this device.

The bunched electron beam can also be provided by a thermionic cathode, a discrete or distributed RF modulation circuit which velocity-modulates the electron beam, and an appropriate drift length through which the velocity-modulated beam becomes a density-modulated beam.

Deflecting the electron beam emitted from a thermionic cathode so that it intermittently lands on the semiconductor target has also been used in electron bombarded semiconductor amplifiers. See for example U.S. Pat. No. 5,052,006 awarded to one of the applicants. Also, the review paper by Silzars et al. describes in detail various electron bombarded semiconductor devices employing thermionic cathodes with the density modulation, velocity modulation, and deflection modulation schemes indicated above. These devices, typical of the prior art, were limited in frequency to 4 GHz and below.

Traveling wave-tube-amplifier (TWTA) technology is a relatively mature technology which was developed several decades ago. One of the limits of the TWTA is its output power which falls off rapidly as the frequency is increased into the millimeter wave range. Average power of the current state-of-the-art millimeter TWTA ranges from the hundreds of watts to several kW.

One of the applicants has patented a high power fast switch (U.S. Pat. No. 4,993,033) which discloses a diamond switch which is switched on by illumination with a pulsed electron beam. Embodiments disclosed in that patent were expected to produce 10–100 kW pulses at a 10–100 MHz repetition rate. Experiments have demonstrated the operation of such a diamond switch. The switched electric pulse follows the waveform of the illuminating electron beam pulses.

Traditional sources of microwave and millimeter wave radiation have been based on solid state devices or vacuum electron devices. Although solid state devices have shown great promise as the source for various applications, they have generally failed to deliver power greater than several watts and efficiencies greater than a few percent. Vacuum electron devices on the other hand generate greater power with higher efficiency; but they tend to be very bulky. What is needed is a very light-weight compact, high power (i.e. several kilowatts) microwave source which can operate within the wavelength range from about 3 millimeters to about 300 millimeters or frequencies from 1 GHz to about 100 GHz.

SUMMARY OF THE INVENTION

A microwave or millimeter wave input signal stimulates a gated field emission array to produce a density modulated beam of electrons containing about 1 billion to 1,000 billion bunches or pulses per second which in turn illuminates a thin diamond target in a diamond switch connecting a load to a high voltage source. Each electron in each pulse creates a large number of electron hole pairs in the diamond. The high voltage bias across the diamond causes most of the very large number of pairs to be swept through the diamond target producing a high current surge in less than one half the period of the designed output frequency. Induced RF currents are set up within the resonant output cavity in response to the current flowing within the diamond in the same manner that induced RF currents are set up in a klystron output cavity in response to electron bunches traveling between the klystron cavity gaps. It is the current gain within the diamond and semiconductor which minimizes the electron emission requirements from the field emitter array. In summary, each surge of current produces an electromagnetic pulse at the load. Thus, an electromagnetic millimeter wave is produced with a frequency equal to the frequency of the signal output. The field emitter array eliminates any thermionic cathode and accompanying power supply and eliminates the need for a velocity modulation circuit and drift space, thereby greatly reducing size and weight.

The high current gain of the diamond switch minimizes emission current requirements, allowing the use of a compact, efficient field emission array. Field emitter arrays suitable tier high frequency operation, do not require a density bunching drift section.

DETAILED DESCRIPTION OF PREFERRED EMBODIMENTS

Millimeter Wave Diamond Amplifier Concept

Figure 1:
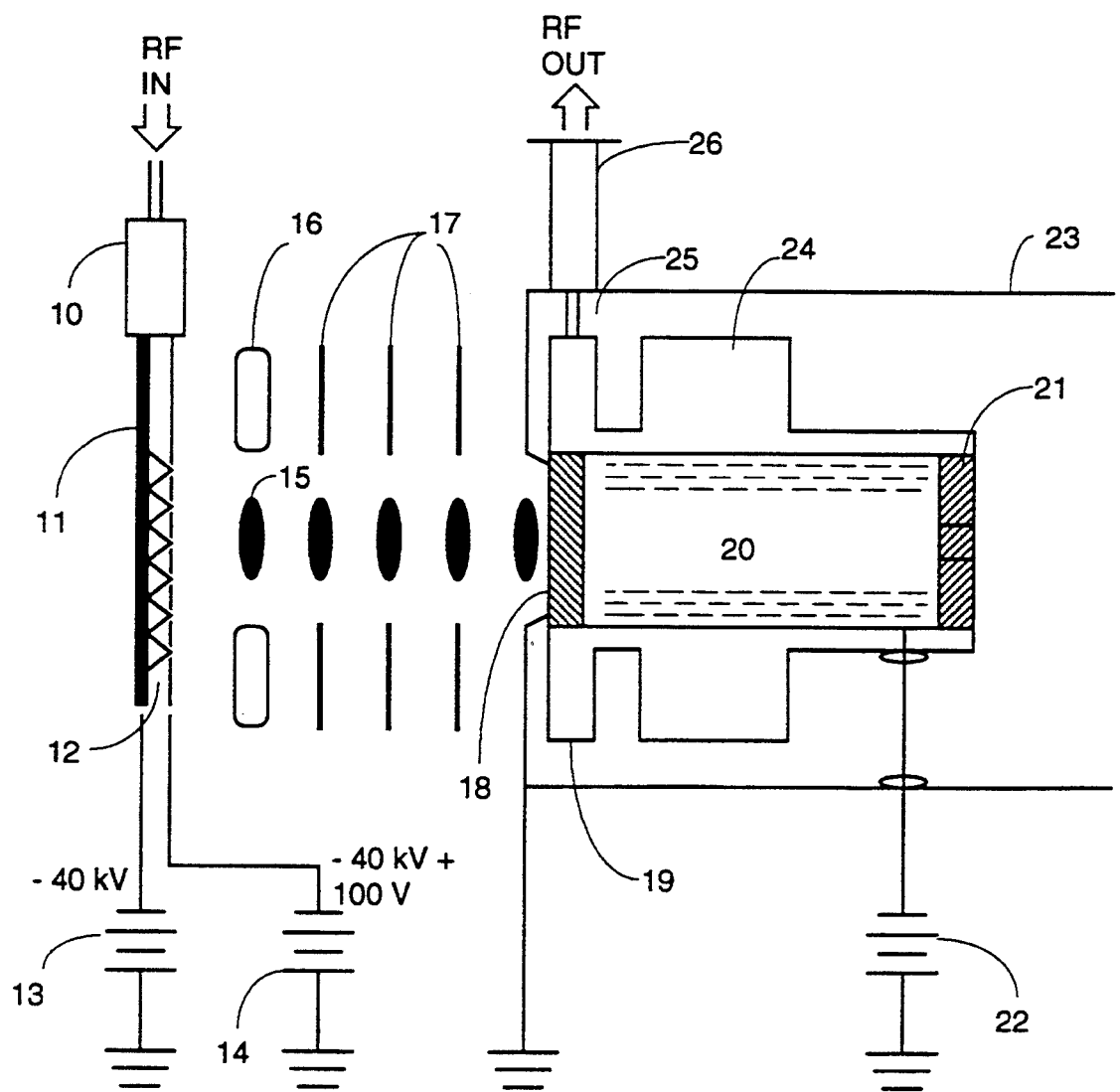
FIG. 1 is a schematic drawing of a high power millimeter wave electron bombarded diamond amplifier which uses a gated field emission array to provide the bunched electron beam. The diamond target is located within a resonant output cavity.

The basic concept of the present invention for producing high power millimeter waves is shown in FIG. 1. As is evident in this drawing the proposed concept exploits the potentials of two different technologies. One is the vacuum microelectronics field emission cathode for producing a pulsed electron beam upon stimulation with a microwave or millimeter wave signal. The other is the high speed, high power capabilities of diamond amplifiers. The concept of a diamond amplifier differs from that of more conventional amplifiers in that the amplification gain comes from carrier generation in response to electron bombardment. The generated carders are repeatedly swept out of the diamond region creating the high power current pulses. The natural pure single crystal type IIa diamond has the best and the most consistent stable properties among the various types of diamond for high speed and high power applications. Single crystal diamond produced through synthetic means can be used as well.

First Preferred Embodiment

One embodiment of our invention is depicted schematically in FIG. 1. An RF signal is sent through a dc block 10 into a cold cathode 11 containing an array of gated field emitters 12. The field emitters are biased to a high voltage with power supply 13. A typical bias voltage is ~40 kV with respect to ground potential. The field emitter gate electrode is biased with power supply 14 to a voltage typically 100 volts above the field emitter bias voltage. A bunched electron beam 15 is emitted from the emitter array in response to the RF voltage imposed across the emitter tips and the gate electrode. The degree of intensity modulation can be controlled by adjusting the gate bias voltage relative to the emitter bias voltage. Class A, class AB, class B, and class C behavior can all be achieved. Because of the exponential nature of field emission, class C behavior is achieved when the same bias voltage is applied to both the emitters and the gate.

The electron bunches are accelerated by the anode 16 and any intermediate electrodes 17 towards the metallized face of the diamond 18 which is mounted within a resonant output cavity 19. Because of the current gain which occurs within the diamond target (on the order of 1,000), only a small electron current must be emitted by the field emitter array. It is expected that at 35 GHz only about 10–30 mA of gated current is required in a 0.4 mm diameter electron beam. This current density, 8–24 A/cm$^2$, is more than one order of magnitude below that which has been achieved by Spindt, et al.. Further details regarding field emission arrays are provided by C. A. Spindt, C. E. Holland, A. Rosengreen, and I. Brodie in "Field-Emitter Arrays for Vacuum Microelectronics," IEEE Transactions on Electron Devices, Vol. 38, no. 10, October 1991.

Conductive post 20 is biased with voltage supply 22. The diamond target 18 is mounted on a conductive post 20 which acts as a heat sink. A thermally conductive electrical insulator such as diamond 21 can be used to attach the post 20 to the body of the output circuit 23. A heat pipe could be used instead of the post 20 to reduce the temperature gradient. Other techniques can be used to electrically isolate the back of the diamond target from the output circuit while still providing a low thermal resistance path to a heat sink.

The output circuit 23 within which the diamond target 18 is mounted contains a resonant cavity 19 and a quarter-wave choke section 24. The choke section 24 translates an effective short circuit to the back of the cavity 19. The cavity 19, dielectrically loaded with the diamond target 18, behaves like the output cavity in a klystron. The current flowing through the diamond target 18 induces an RF current within the cavity 19. The RF electric fields are concentrated across the cavity gap which is bridged by the diamond 18. As the current within the diamond 18 is decelerated by the RF electric fields, the RF electric fields build up. At resonance, amplification occurs as in a klystron output cavity. RF power is extracted through an iris 25 in the cavity wall to an output waveguide 26.

The diamond target 18 is in the form of a diamond chip or diamond film. For a 35 GHz diamond amplifier, the diamond chip diameter is about 0.4 mm in diameter and about 3 $\mu$m thick. Suitable diamond chips are obtainable from Drukker International.

A magnetic field, provided by external permanent magnets or a solenoid, can be used to help confine and focus the electron bunches onto the diamond target. Electrostatic focusing can accomplish the same objective. The gain of the amplifier may be increased at the expense of increased size and weight by further compressing the electron bunches with a klystron cavity located between the cathode and the diamond target.

Figure 2:
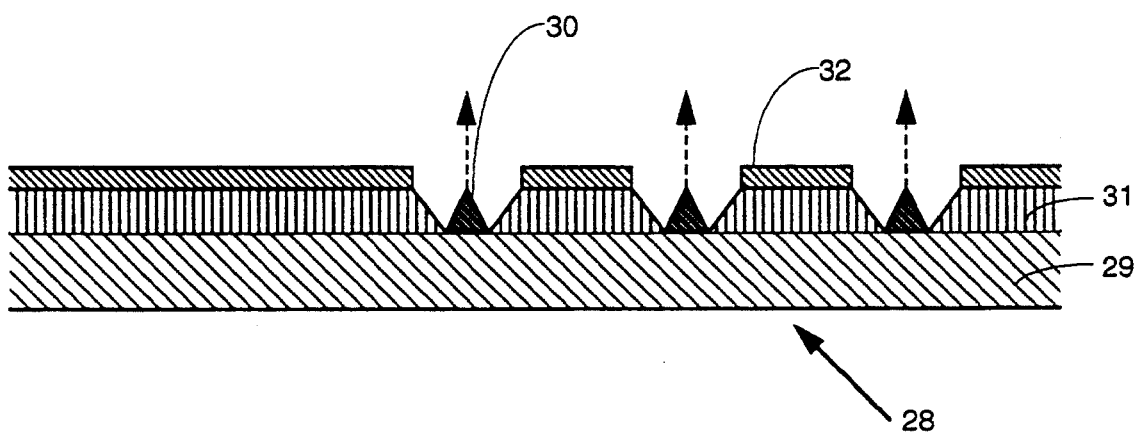
FIG. 2 is an enlarged, partial cross sectional view of a gated field emitter array.
Figure 3:
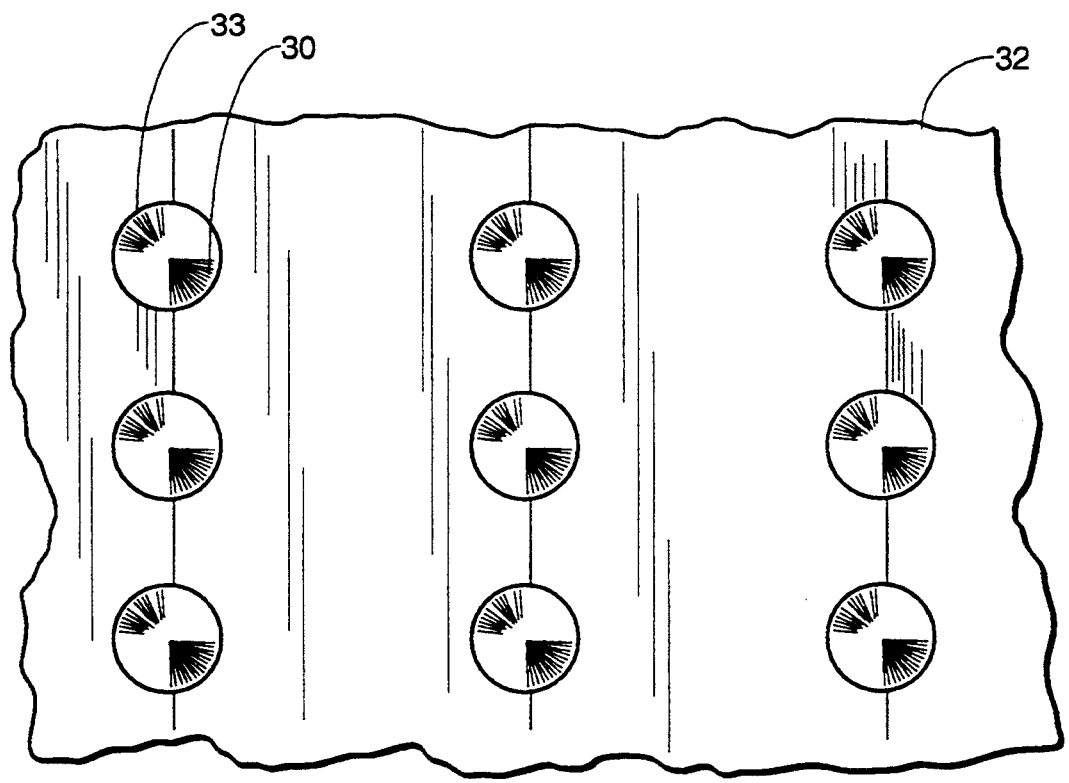
FIG. 3 is an enlarged, top view of a gated field emitter array.

An enlarged, partial cross-sectional view of the field emission array 28 is shown in FIG. 2. A top view of a field emission array 2 is shown in FIG. 3. The substrate 29 can be a semiconductor or a conductor. Multiple emitters 30 are distributed on the substrate. The emitters 30 are typically molybdenum, tungsten, silicon, or gallium arsenide and can be conical or wedge-like in shape. Any shape which results in a sharp corner or tip and produces a field enhancement factor of 100–1,000 is suitable. An insulating layer 31, such as silicon dioxide, is formed on the substrate 29 and surrounds the emitters 30. On top of the insulating layer 31 is a conductive gate layer 32. The gate 32 may be fabricated of a conductor such as copper, gold, aluminum, or a semiconductor such as silicon or gallium arsenide. The gate layer 32 is fabricated with holes 33 aligned above each emitter 30. The tips of the emitters 30 are centered in the holes 33 and aligned with the plane of the gate 32.

Ellipsoidal holes are required for field emitters with a wedge-like geometry. There is some evidence that single crystal emitters and gates are preferred because of their reduced susceptibility to damage.

One example of a vacuum microelectronics field emitter array can be found in Spindt et al. The molybdenum emitters are nearly 1 $\mu$m high, the gate layer is about $\frac{1}{4}$ $\mu$m thick, and the emitters are separated by a least 3 $\mu$m.

Figure 4:
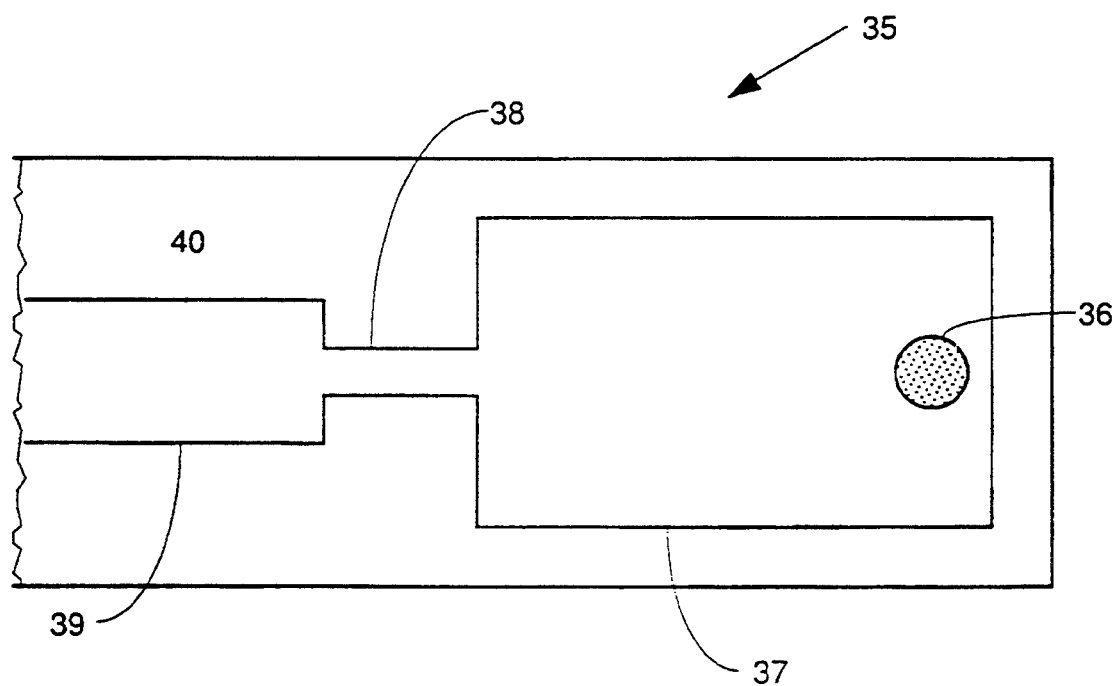
FIG. 4 is a top view of a resonant microstrip circuit element with a field emitter array imbedded in a region of maximum electric field.

FIG. 4 is a top view of a resonant microstrip circuit 35 which can be used to apply an RF voltage across the field emitter array 36. The microstrip circuit 36 is similar in construction to a microstrip antenna. Microstrip antennas of this type are described in detail in *Microstrip Antenna Design*, K. C. Gupta and A. Benalia, Eds. Artech House, Norwood, Mass., 1988.

In this embodiment of our invention, the length of the resonant microstrip 37 must be reduced from its unloaded length of one half wavelength because of the capacitance of the emitter array 36. A quarter-wave transformer 38 is used to impedance match the loaded microstrip element to the 50 ohm microstrip input 39. The emitter tips are at the same potential as the lower conductive plane 40 and the gate electrode is at the same potential as the resonant microstrip 37. With the emitter array 36 mounted within the microstrip circuit 35 as shown in FIG. 4, the emitter tips are mounted on the lower conductive plane 40 and the resonant microstrip circuit 37 acts as the gate electrode. Other embodiments of the microstrip circuit in FIG. 4 can also be used to impress RF voltages across an emitter array at the microwave and millimeter wave frequencies.

Figure 5:
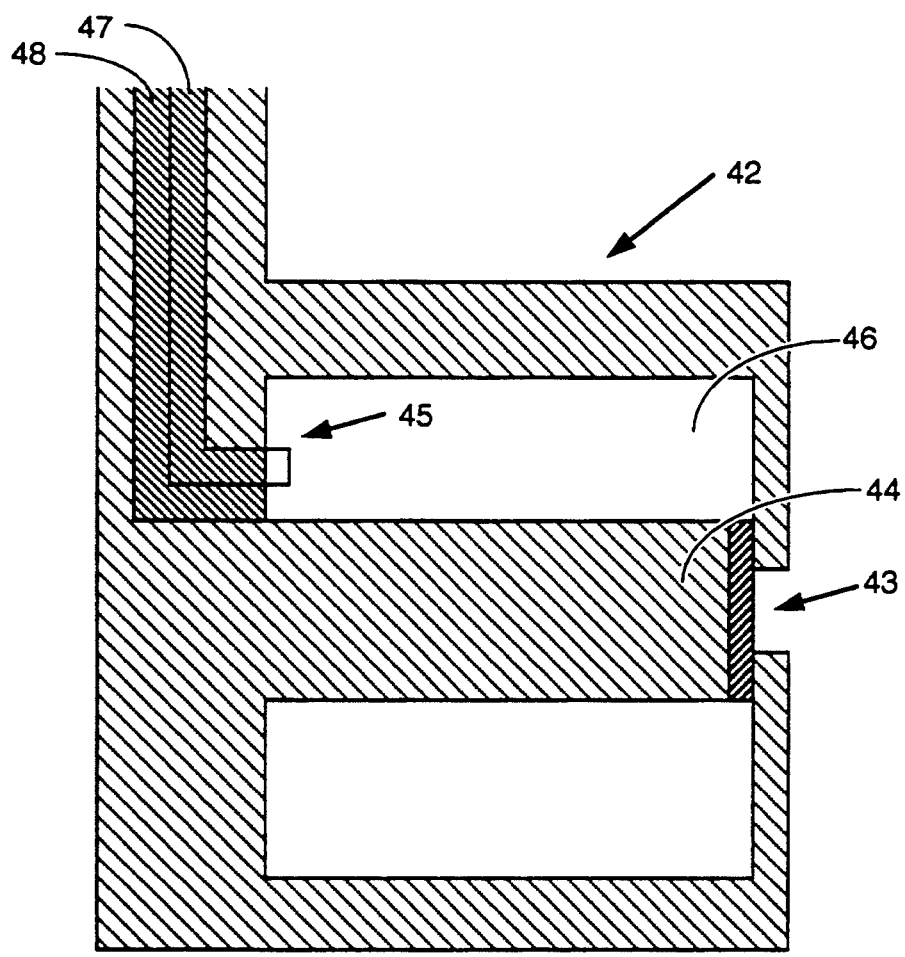
FIG. 5 is a cross-sectional view of a resonant cavity within which is mounted a field emitter array.

FIG. 5 is a cross-sectional view, not to scale, of a resonant cavity 42 used to impress RF voltages across an emitter array at microwave and millimeter wave frequencies. The emitter array 43 is mounted on a conductive post 44 in the center of the cavity. As in the buncher cavity of a klystron, RF fields are imposed across the cavity gap in response to an RF signal coupled into the cavity at resonance. In this embodiment, the RF signal is coupled in through a loop 45 at the back of the cavity 46 via a coaxial line 47 with insulator 48. While coupling to the RF magnetic field is shown in FIG. 6, other means of coupling the input RF signal can be used such as coupling through a slot in the cavity wall.

Figure 6:
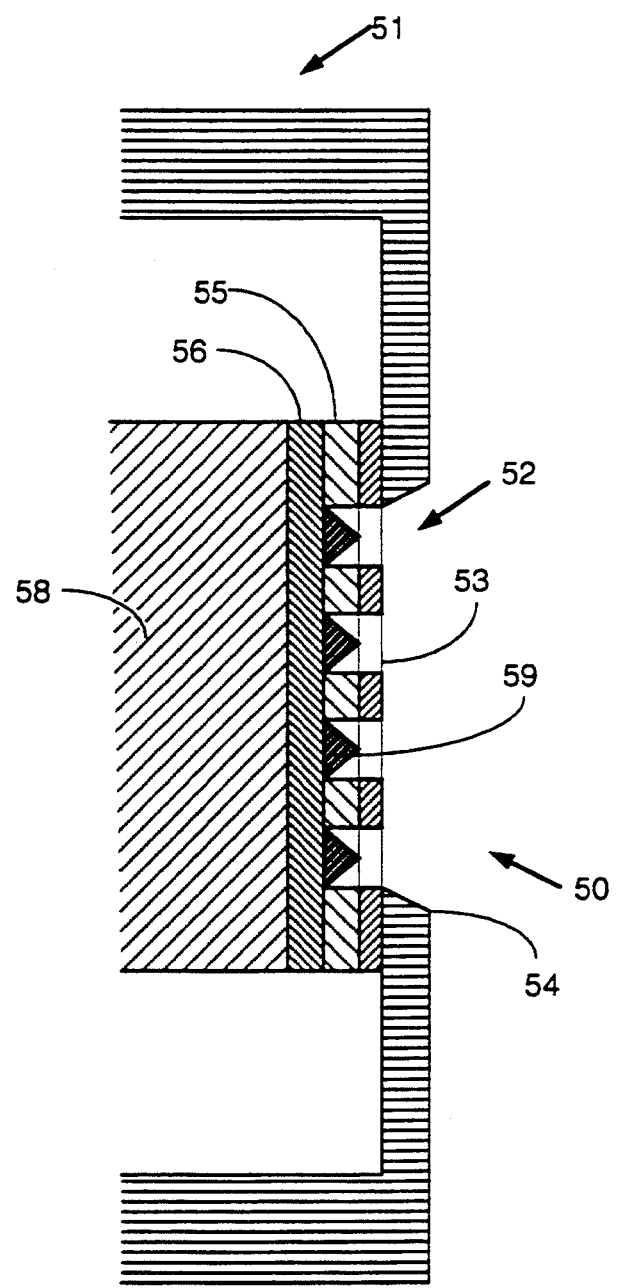
FIG. 6 is an enlarged cross-sectional view of a field emitter array mounted within a resonant cavity.

FIG. 6 is an enlarged, partial cross-sectional view, not to scale, of an emitter array 50 mounted within the resonant cavity structure 51 depicted in FIG. 5. The emitter array 50 can bridge the cavity gap 52 as is shown in FIG. 6. The array gate conductor 53 is electrically connected to the gap tips 54 either directly, as shown in FIG. 6, or through a conductive spacer which can be used to increase the gap height. The insulator 55 separates the array gate conductor 53 from the array substrate 56. The array substrate 56 is bonded to the conductive center post 58 of the cavity structure 51. Electrons are emitted via field emission from the emitter tips 59. The cavity structure as depicted in FIGS. 6 and 7 does not include any means of dc biasing the emitter array gate conductor. DC biasing of the gate conductor can be achieved by means similar to those shown in FIG. 2 for biasing the electrodes covering the face of the diamond film.

The above descriptions do not limit the scope of the invention but are examples of preferred embodiments. Those skilled in the art will envision many possible variations within its scope. The scope of the invention is better described by the following claims:

We claim:

1. An amplifier device for amplifying microwaves or millimeter wave input signals comprising:
    a) an output circuit resonant at microwave frequencies;
    b) a diamond switch means connecting said output circuit to a high voltage source so as to provide a high voltage to said output circuit wherein said diamond switch is effectively closed by illuminating with a pulse of electrons;
    c) a gated field emission array means for providing pulses of electrons at microwave or millimeter wave frequencies upon stimulation with a varying electric field provided by the input signal; and;
    d) a beam control means for accelerating and directing said pulses to produce an electron beam pulsing at the frequency of the input signal for illuminating said diamond switch.

* * * * *